(12) United States Patent
Biran et al.

(10) Patent No.: US 10,740,516 B2
(45) Date of Patent: Aug. 11, 2020

(54) MODIFYING CIRCUITS TO PREVENT REDUNDANT SWITCHING

(71) Applicant: INTERNATIONAL BUSINESS MACHINES CORPORATION, Armonk, NY (US)

(72) Inventors: Giora Biran, Haifa (IL); Eli Arbel, Nesher (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 160 days.

(21) Appl. No.: 15/970,979

(22) Filed: May 4, 2018

(65) Prior Publication Data

US 2019/0340312 A1    Nov. 7, 2019

(51) Int. Cl.
  *G06F 30/327*   (2020.01)
  *G06F 11/36*    (2006.01)
  *G06F 30/3323*  (2020.01)

(52) U.S. Cl.
  CPC ........ *G06F 30/327* (2020.01); *G06F 11/3608* (2013.01); *G06F 30/3323* (2020.01)

(58) Field of Classification Search
  CPC .. G06F 17/5031; G06F 17/504; G06F 17/505; G06F 17/5009; G06F 17/5022; G06F 17/5036; G06F 11/36; G06F 11/3608; G06F 2217/78; G06F 2217/84; G06F 30/327; G06F 30/3323
  USPC ....................................................... 716/106
  See application file for complete search history.

(56) References Cited

U.S. PATENT DOCUMENTS

| 2006/0282807 A1* | 12/2006 | Ivancic .............. G06F 11/3608 716/106 |
| 2010/0257494 A1* | 10/2010 | Pouarz ................. G06F 17/504 716/111 |
| 2011/0144958 A1 | 6/2011 | Flur et al. |
| 2011/0271242 A1 | 11/2011 | Baumgartner et al. |
| 2013/0019216 A1* | 1/2013 | Vasudevan ........... G06F 17/504 716/106 |
| 2017/0124240 A1 | 5/2017 | Baumgartner et al. |

OTHER PUBLICATIONS

Mell, Peter and Tim Grance, "The NIST Definition of Cloud Computing," National Institute of Standards and Technology, Information Technology Laboratory, Special Publication 800-145, Sep. 2011, pp. 1-7.

* cited by examiner

Primary Examiner — Paul Dinh
(74) Attorney, Agent, or Firm — William A. Kinnaman, Jr. Esq.; Blanche E. Schiller, Esq.; Heslin Rothenberg Farle Mesiti P.C.

(57) ABSTRACT

An unobservable cycle for at least one latch in a circuit design is detected. The unobservable cycle indicates that the at least one latch is not observable to downstream logic in the circuit design. A coverage event is generated to identify the unobservable cycle for the at least one latch. The coverage event is tracked to detect a state associated with the unobservable cycle and a state change cycle. The state change cycle is determined based on a simulation technique. A redundant switching of the at least one latch based on the state associated with the unobservable cycle and the state change cycle is determined. Furthermore, manufacturing of a circuit based on the circuit design is at least initiated. The circuit design is modified to prevent the redundant switching of the at least one latch.

20 Claims, 6 Drawing Sheets

MODIFYING CIRCUITS TO PREVENT REDUNDANT SWITCHING

BACKGROUND

One or more aspects of the present disclosure relate to circuit designs, and more specifically, but not exclusively, to modifying circuit designs.

SUMMARY

Shortcomings of the prior art are overcome and additional advantages are provided through the provision of a system to facilitate manufacturing of circuits. The system includes at least one processor to perform a method. The method includes detecting an unobservable cycle for at least one latch in a circuit design. The unobservable cycle indicates that the at least one latch is not observable to downstream logic in the circuit design. A coverage event is generated to identify the unobservable cycle for the at least one latch, and the coverage event is tracked to detect a state associated with the unobservable cycle and a state change cycle. The state change cycle is determined based on a simulation technique, and the state change cycle includes a cycle in which the at least one latch changes a value from a previous state. A redundant switching of the at least one latch based on the state associated with the unobservable cycle and the state change cycle is determined. Manufacturing of a circuit based on the circuit design is at least initiated. The circuit design is modified to prevent the redundant switching of the at least one latch.

Computer-implemented methods and computer program products relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
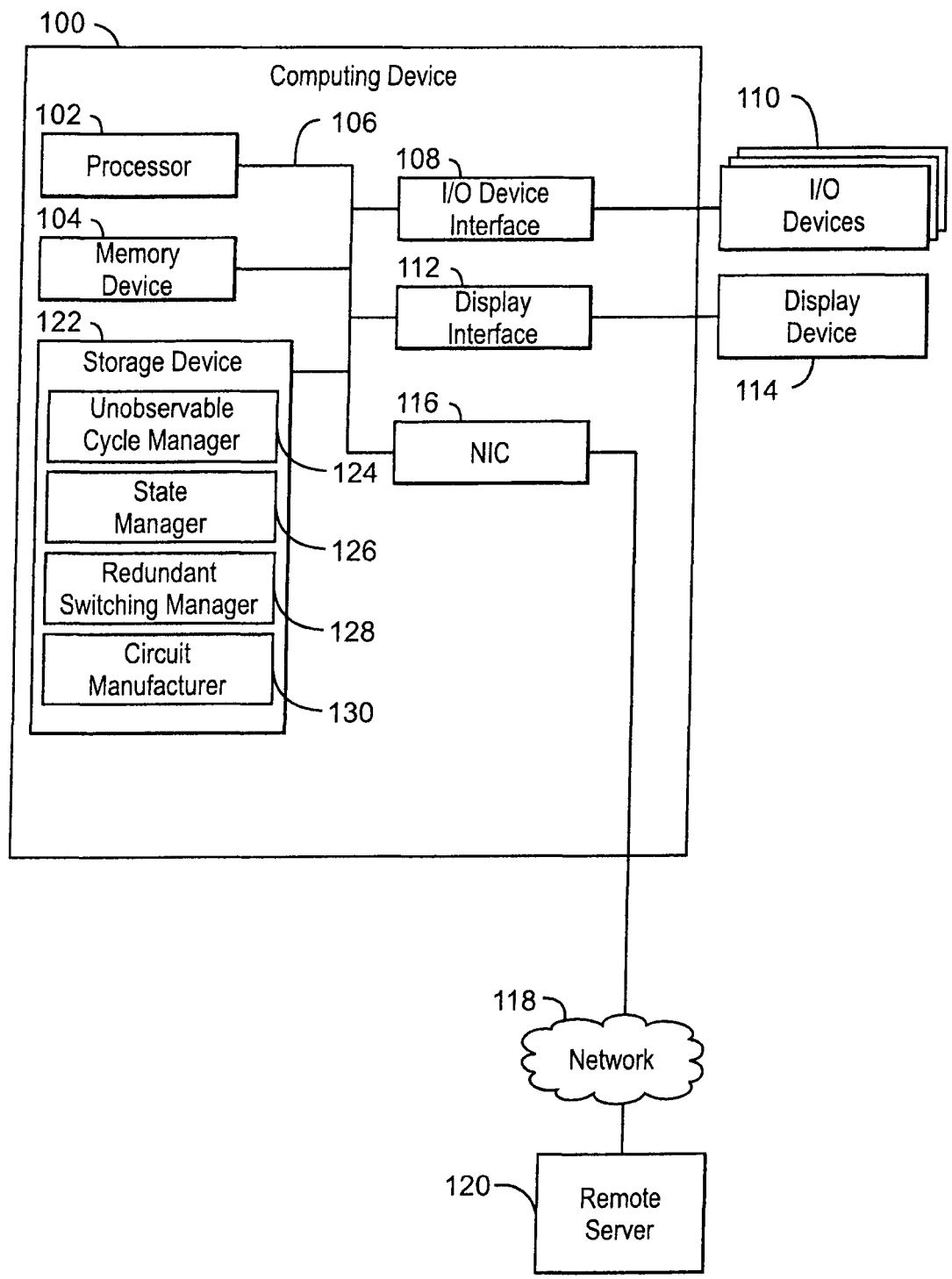
FIG. 1 depicts a block diagram of an example computing system that can modify a circuit to prevent redundant switching of a latch according to an embodiment described herein.

Digital circuits can include any suitable number of logic gates. The logic gates can select signals to transmit and store, in some examples. However, some conditions of the logic gates may not affect downstream logic or a second set of logic gates that receive input signals from a first set of logic gates. Accordingly, identifying these conditions, also referred to herein as redundant switching conditions, can enable modifications to digital circuits that prevent providing power to logic gates involved in redundant switching conditions.

In some examples, modifications of the circuit can be measured with static timing analysis (STA), which simulates the expected timing of a digital circuit without requiring a simulation of the full circuit. In some examples, high performance integrated circuits have traditionally been characterized by the clock frequency at which the integrated circuits operate. Determining the ability of a circuit to operate at a specified speed may include measuring, during the design process, the delay within the circuit. Moreover, delay calculation can be incorporated into the inner loop of timing optimizers at various phases of design, such as logic synthesis, layout (placement and routing), and in in-place optimizations performed late in the design cycle. Static timing analysis enables the fast and reasonably accurate measurement of circuit timing.

In some examples, the structure and behavior of electronic circuits and digital logic circuits can be described using a hardware description language (HDL). HDLs enable precise, formal descriptions of electronic circuits that allow for automated analysis and simulation. For example, the electronic circuits may include complex circuits, such as application-specific integrated circuits (ASICs), microprocessors, and programmable logic devices (PLDs). HDLs are standard text-based expressions of the structure of electronic systems and their behavior over time. HDLs thus also include an explicit notion of time, which may be a primary attribute of hardware. For example, the Very High Speed Integrated Circuit (VHSIC) Hardware Description Language (VHDL) is an HDL used in electronic design automation to describe digital and mixed-signal systems, such as field-programmable gate arrays and integrated circuits. A macro written in VHDL may include multiple design abstractions organized as a hierarchy. For example, a higher level of a hierarchy may be a register-transfer level (RTL). An RTL can be used to model a synchronous digital circuit in terms of the flow of digital signals (data) between hardware registers, and the logical operations performed on those signals. In some examples, lower-level representations and ultimately actual wiring can be derived from higher level representations.

According to an embodiment described herein, a system for manufacturing circuits may include a processor to detect an unobservable cycle for at least one latch in a circuit design, wherein the unobservable cycle indicates the at least one latch is not observable to downstream logic in the circuit design. The system may also generate a coverage event to identify the unobservable cycle for the at least one latch and track the coverage event to detect a state associated with the unobservable cycle and a state change cycle, wherein the state change cycle is determined based on a simulation technique. In some examples, the state change cycle comprises a cycle in which the at least one latch changes values from a previous state. In addition, the system can determine a redundant switching of the at least one latch based on the state associated with the unobservable cycle and the state change cycle. Furthermore, the system may manufacture a circuit based on the circuit design, wherein the circuit design is modified to prevent the redundant switching of the at least one latch based in part on the unobservable cycle. In some examples, the modified circuit may be evaluated with timing analysis techniques to determine if the modified circuit can be manufactured to enable power savings by the circuit.

Accordingly, aspects of the techniques described herein can enable the design and manufacture of a circuit without redundant switching of latches. Therefore, aspects of the techniques described herein can reduce the power consumption of a circuit by preventing latches from switching states unnecessarily thus wasting power. For example, the techniques may modify the circuit design to prevent redundant switching of a latch based on circuit analysis and clock gating techniques.

With reference now to FIG. 1, an example computing device is depicted that can modify a circuit to prevent redundant switching of a latch. The computing device 100 may be for example, a server, desktop computer, laptop computer, tablet computer, or smartphone. In some examples, computing device 100 may be a cloud computing node. Computing device 100 may be described in the general context of computer system executable instructions, such as program modules, being executed by a computer system. Generally, program modules may include routines, programs, objects, components, logic, data structures, and so on that perform particular tasks or implement particular abstract data types. Computing device 100 may be practiced in distributed cloud computing environments where tasks are performed by remote processing devices that are linked through a communications network. In a distributed cloud computing environment, program modules may be located in both local and remote computer system storage media including memory storage devices.

The computing device 100 may include a processor 102 that is adapted to execute stored instructions, and a memory device 104 to provide temporary memory space for operations of the instructions during operation. The processor can be a single-core processor, multi-core processor, computing cluster, or any number of other configurations. The memory 104 can include random access memory (RAM), read only memory, flash memory, or any other suitable memory systems.

The processor 102 may be connected through a system interconnect 106 (e.g., PCI®, PCI-Express®, etc.) to an input/output (I/O) device interface 108 adapted to connect the computing device 100 to one or more I/O devices 110. The I/O devices 110 may include, for example, a keyboard and a pointing device, wherein the pointing device may include a touchpad or a touchscreen, among others. The I/O devices 110 may be built-in components of the computing device 100, or may be devices that are externally connected to the computing device 100.

The processor 102 may also be linked through the system interconnect 106 to a display interface 112 adapted to connect the computing device 100 to a display device 114. The display device 114 may include a display screen that is a built-in component of the computing device 100. The display device 114 may also include a computer monitor, television, or projector, among others, that is externally connected to the computing device 100. In addition, a network interface controller (NIC) 116 may be adapted to connect the computing device 100 through the system interconnect 106 to the network 118. In some embodiments, the NIC 116 can transmit data using any suitable interface or protocol, such as the internet small computer system interface, among others. The network 118 may be a cellular network, a radio network, a wide area network (WAN), a local area network (LAN), or the Internet, among others. A remote server 120 may connect to the computing device 100 through the network 118.

The processor 102 may also be linked through the system interconnect 106 to a storage device 122 that can include a hard drive, an optical drive, a USB flash drive, an array of drives, or any combinations thereof. In some examples, the storage device 122 may include an unobservable cycle manager 124, a state manager 126, a redundant switching manager (or detector) 128, and a circuit manufacturer 130. In some embodiments, the unobservable cycle manager 124 can detect an unobservable cycle for at least one latch in a circuit design, wherein the unobservable cycle indicates the at least one latch is not observable to downstream logic in the circuit design. In some embodiments, the unobservable cycle manager 124 can also generate a coverage event to identify the unobservable cycle for the at least one latch. In some examples, the state manager 126 can track the coverage event to detect a state associated with the unobservable cycle and a state change cycle, wherein the state change cycle is determined based on a simulation technique. In some examples, the state change cycle comprises a cycle in which the at least one latch changes values from a previous state. In addition, a redundant switching manager 128 can determine a redundant switching of the at least one latch based on the state associated with the unobservable cycle and the state change cycle. In some embodiments, the circuit manufacturer 130 can initiate and/or manufacture a circuit based on the circuit design, wherein the circuit design is modified to prevent the redundant switching of the at least one latch based in part on the unobservable cycle.

It is to be understood that the block diagram of FIG. 1 is not intended to indicate that the computing device 100 is to include all of the components shown in FIG. 1. Rather, the computing device 100 can include fewer or additional components not illustrated in FIG. 1 (e.g., additional memory components, embedded controllers, modules, additional network interfaces, etc.). Furthermore, any of the functionalities of the unobservable cycle manager 124, state manager 126, redundant switching manager 128, and circuit manufacturer 130 may be partially, or entirely, implemented in hardware and/or in the processor 102. For example, the functionality may be implemented with an application specific integrated circuit, logic implemented in an embedded controller, or in logic implemented in the processor 102, among others. In some embodiments, the functionalities of the unobservable cycle manager 124, state manager 126, redundant switching manager 128, and circuit manufacturer 130 can be implemented with logic, wherein the logic, as referred to herein, can include any suitable hardware (e.g., a processor, among others), software (e.g., an application, among others), firmware, or any suitable combination of hardware, software, and firmware.

Figure 2:
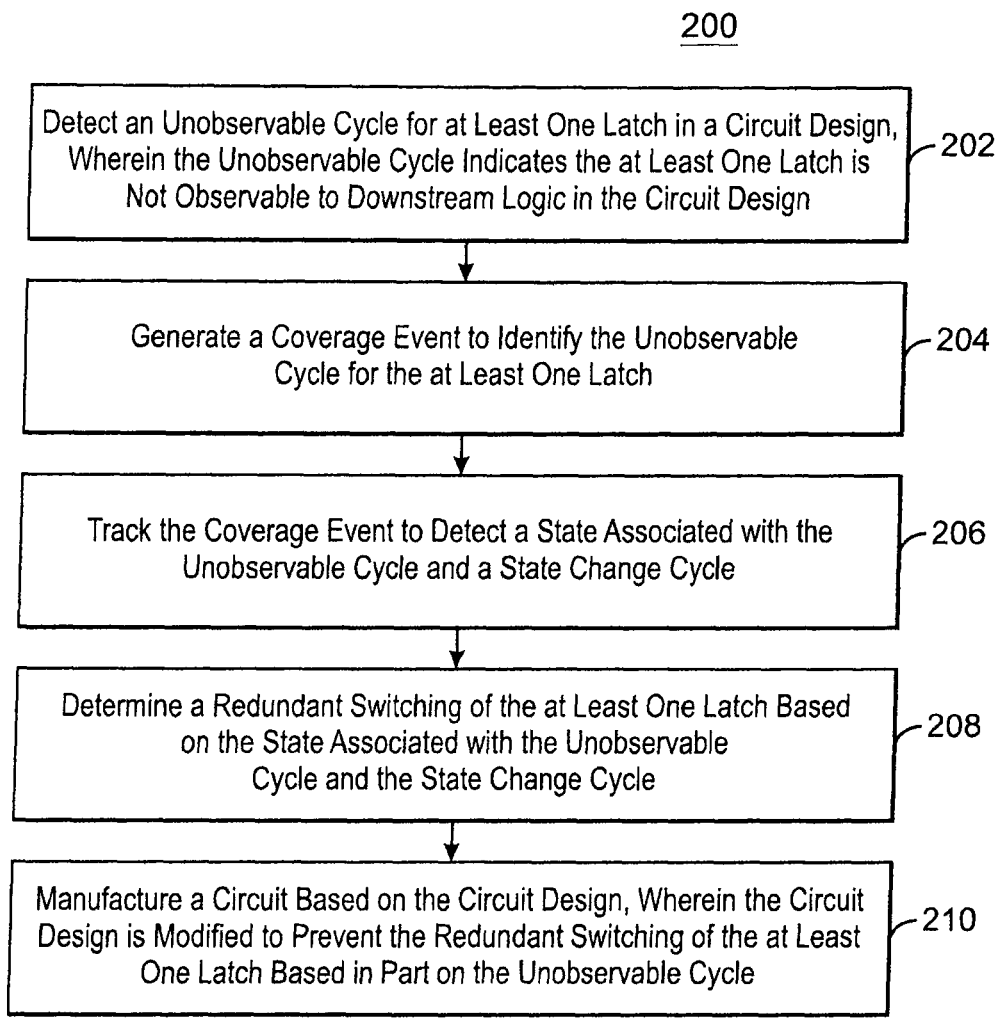
FIG. 2 is a process flow diagram of an example method that can modify a circuit to prevent redundant switching of a latch according to an embodiment described herein.

FIG. 2 is a process flow diagram of an example method that can modify a circuit to prevent redundant switching of a latch. The method 200 can be implemented with any suitable computing device, such as the computing device 100 of FIG. 1.

At block 202, an unobservable cycle manager 124 can detect an unobservable cycle for at least one latch in a circuit design, wherein the unobservable cycle indicates the at least one latch is not observable to downstream logic in the circuit design. A latch, as referred to herein, can include a flip-flop or a circuit that has two stable states that can be used to store state information. The downstream logic, as referred to herein, can include any suitable logic in a circuit that receives a signal from a separate latch or flip-flop storing a value. For example, downstream logic can include any suitable logic, such as an "AND" gate, "OR" gate, "NAND" gate, and the like, that receives a signal based on a value stored in a latch or flip-flop. In some cycles, the downstream logic can operate independently of the value stored in the latch or flip-flop. For example, the downstream logic can result in a constant Boolean output regardless of the value stored in the latch or flip-flop and transmitted to the downstream logic. In some examples, the unobservable cycle manager 124 can detect the unobservable cycle for the at least one latch in a circuit design via a formal verification technique. For example, a formal verification technique can include detecting a path for a signal between any number of latches of a circuit.

In some embodiments, the unobservable cycle manager 124 can detect an unobservable cycle based on a set of fanout points associated with the at least one latch. A fanout point, as referred to herein, can include an input pin corresponding to logic, wherein the input pin receives a signal from a latch or flip-flop. For example, a Boolean value can be transmitted from at least one latch to each fanout point or input pin in downstream logic. In some embodiments, the unobservable cycle manager 124 can detect the unobservable cycle based on a set of sequential signals from interconnected computation logic. For example, a series of gates or logic can be interconnected and a result of the series of gates or logic may not change a result of downstream logic. Sequential signals are described in greater detail below in relation to FIG. 3.

In some embodiments, at least one latch corresponding to an unobservable cycle can reside in any suitable macro. A macro, as referred to herein, can include a sub-division of a circuit based on related logic that performs a common task. For example, a macro can include logic performing an adder calculation, or logic performing address generation, among others.

At block 204, the unobservable cycle manager 124 can also generate a coverage event to identify the unobservable cycle for the at least one latch. In some embodiments, the coverage event can include any suitable number of signals that relate to the unobservable cycle. For example, the unobservable cycle manager 124 can detect a coverage event that includes a plurality of signals to be monitored in a circuit. The signals can include any suitable Boolean signal based on "AND," "OR," "XOR," and "NOR" logic gates, among others. The unobservable cycle manager 124 can combine the signals to detect a coverage event corresponding to an unobservable cycle. For example, the unobservable cycle can include any cycle in which a value stored or kept stable by a latch or flip-flop in a circuit cannot be detected by downstream logic.

In some examples, the coverage event can include signals from any number of latches that provide an unobservable input to a downstream latch that can operate based on the input in some observable cases. In one example, a downstream latch may operate based on a different input from a separate first set of latches in an unobservable cycle in which input from a second set of latches is disregarded or unobservable. In some embodiments, the unobservable cycle manager 124 can generate the coverage event to identify the unobservable cycle for at least one latch based on a formal verification technique.

At block 206, a state manager 126 can track the coverage event to detect a state associated with the unobservable cycle and a state change cycle, wherein the state change cycle is determined based on a simulation technique. In some examples, the state change cycle comprises a cycle in which the at least one latch changes values from a previous state. In some embodiments, the state manager 126 can detect if a Boolean value stored or kept stable by the latch transitions from a first value to a second value. For example, the state manager 126 can detect if a latch transitions from storing a zero value to a one value or from storing a one value to a zero value. In some embodiments, the simulation technique can include simulating the structure and behavior of electronic circuits and digital logic circuits using a hardware description language (HDL).

At block 208, a redundant switching manager 128 can determine a redundant switching of the at least one latch based on the state associated with the unobservable cycle and the state change cycle. In some examples, the redundant switching manager 128 can generate an auxiliary latch associated with the latch, wherein the auxiliary latch stores a previous value of the latch. Accordingly, the redundant switching manager 128 can detect if a value stored by a latch has transitioned from a first state to a second state and whether the value is unobservable by downstream logic. In some examples, the redundant switching manager 128 can identify cycles corresponding to the latch that are to be clock gated in which power is not to be provided to the latch.

At block 210, a circuit manufacturer 130 can initiate manufacture and/or manufacture a circuit based on the circuit design, wherein the circuit design is modified to prevent the redundant switching of the latch based in part on the unobservable cycle. In some embodiments, the modified circuit design comprises logic to prevent power to a multiplexor for a coverage event in which a signal is unobservable. For example, the modified circuit design can add new logic gates or modify existing logic gates to prevent clocking a latch during coverage events corresponding to unobservable cycles for the latch. In some examples, the circuit manufacturer 130 can modify a logic of a circuit based on a modification to the latch to prevent redundant switching. A modification can include adding clock gating to the latch. In some embodiments, the circuit manufacturer 130 can transmit instructions to an automated manufacturing device to manufacture a circuit based on the modified circuit design. The circuit manufacturer 130 can fabricate a circuit based on a circuit design including the modified logic to prevent redundant switching.

The process flow diagram of FIG. 2 is not intended to indicate that the operations of the method 200 are to be executed in any particular order, or that all of the operations of the method 200 are to be included in every case.

Figure 3:
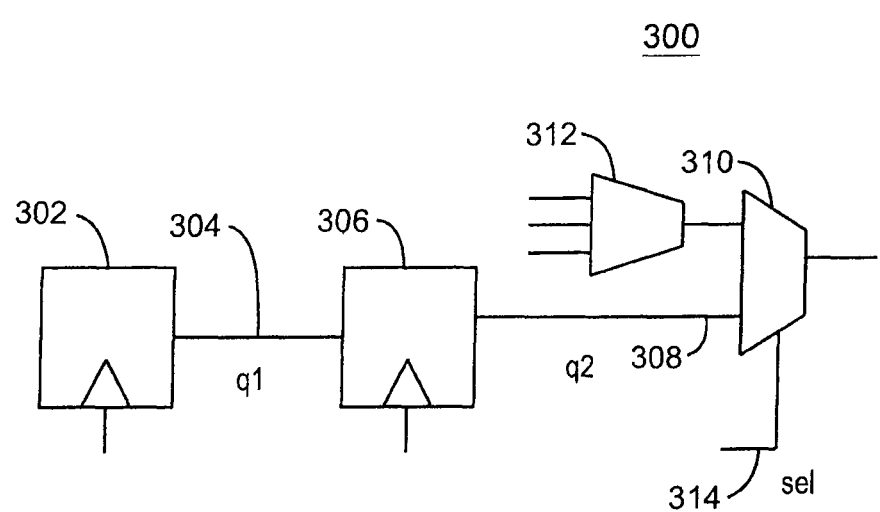
FIG. 3 is an example block diagram of a sequential set of latches with redundant switching.

FIG. 3 is an example block diagram of a sequential set of latches with redundant switching. For example, a circuit 300 can include a latch 302 that can transmit a signal q1 304 to latch 306, which can forward the signal q2 308 to a multiplexer 310. The multiplexer 310 can forward the signal q2 308 from latch 306 or a signal from latch 312 based on a selection (sel) value 314. During cycles in which the signal is forwarded from latch 312, the signal q1 304 from latch 302 and signal q2 308 from latch 306 are unobservable. Accordingly, latch 302 and latch 306 may be redundantly switching values during these cycles. A modification to the circuit design to prevent power to latch 302 and latch 306 during the unobservable cycles can reduce power consumption of the circuit. In some examples, such modifications may include adding clock gating logic to latch 302 and latch 306 based on the selection value signal 314.

It is to be understood that the circuit 300 can include fewer or additional logic gates, macros, interconnects, and the like. In some examples, any suitable number of arrays can be added between the latches 302, 306, and 312 of the circuit 300.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
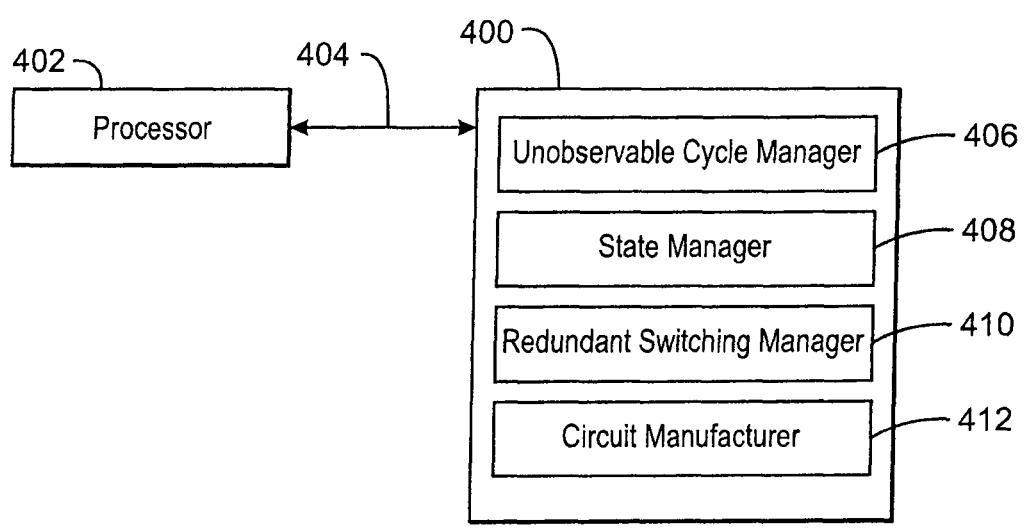
FIG. 4 is a tangible, non-transitory computer-readable medium that can modify a circuit to prevent redundant switching of a latch according to an embodiment described herein.

Referring now to FIG. 4, a block diagram is depicted of an example of a tangible, non-transitory computer-readable medium that can modify a circuit to prevent redundant switching of a latch. The tangible, non-transitory, computer-readable medium 400 may be accessed by a processor 402 over a computer interconnect 404.

Furthermore, the tangible, non-transitory, computer-readable medium 400 may include code to direct the processor 402 to perform the operations of the current method. For example, an unobservable cycle manager 406 can detect an unobservable cycle for at least one latch in a circuit design, wherein the unobservable cycle indicates the at least one latch is not observable to downstream logic in the circuit design. In some embodiments, the unobservable cycle manager 406 can also generate a coverage event to identify the unobservable cycle for the at least one latch. In some examples, a state manager 408 can track the coverage event to detect a state associated with the unobservable cycle and a state change cycle, wherein the state change cycle is determined based on a simulation technique. In some examples, the state change cycle comprises a cycle in which the at least one latch changes values from a previous state. In addition, a redundant switching manager 410 can determine a redundant switching of the at least one latch based on the state associated with the unobservable cycle and the state change cycle. In some embodiments, a circuit manufacturer 412 can initiate manufacture and/or manufacture a circuit based on the circuit design, wherein the circuit design is modified to prevent the redundant switching of the at least one latch based in part on the unobservable cycle.

It is to be understood that any number of additional software components not shown in FIG. 4 may be included within the tangible, non-transitory, computer-readable medium 400, depending on the specific application. Furthermore, fewer software components than those shown in FIG. 4 can be included in the tangible, non-transitory, computer-readable medium 400.

One or more aspects may relate to cloud computing.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
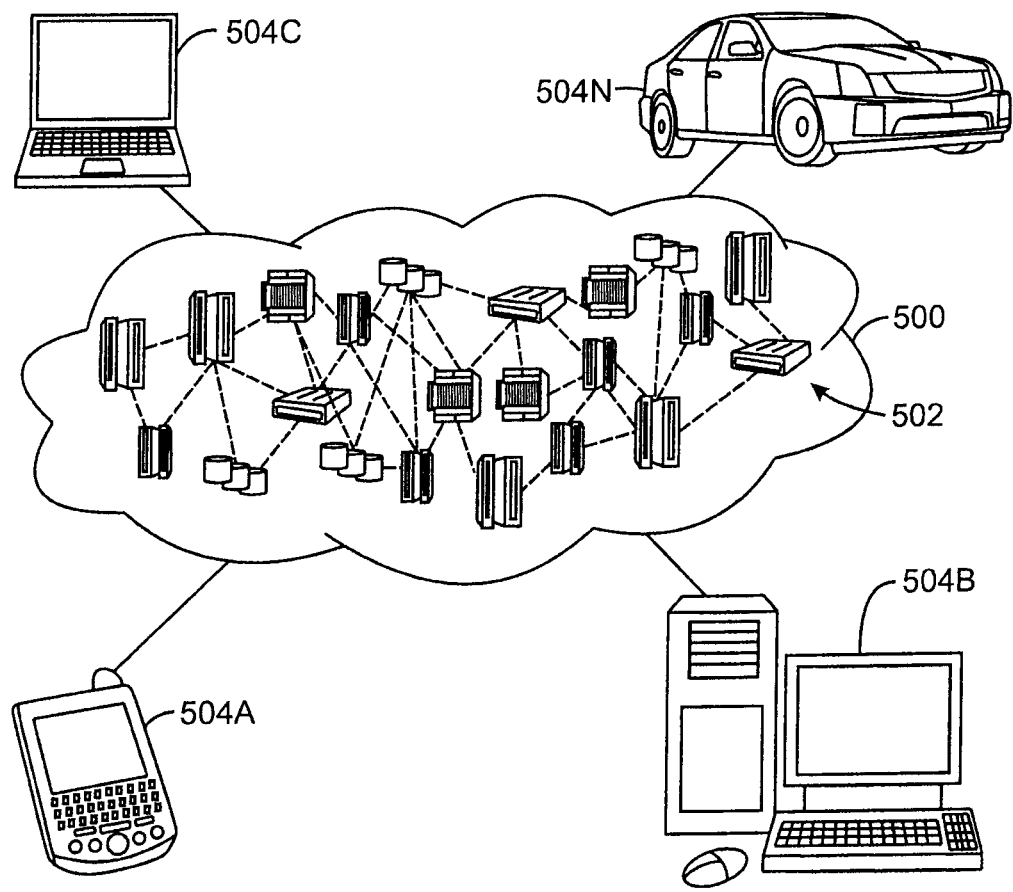
FIG. 5 depicts an illustrative cloud computing environment according to an embodiment described herein.

Referring now to FIG. 5, illustrative cloud computing environment 500 is depicted. As shown, cloud computing environment 500 includes one or more cloud computing nodes 502 with which local computing devices used by cloud consumers, such as, for example, personal digital assistant (PDA) or cellular telephone 504A, desktop computer 504B, laptop computer 504C, and/or automobile computer system 504N may communicate. Nodes 502 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 504A-N shown in FIG. 5 are intended to be illustrative only and that computing nodes 502 and cloud computing environment 500 can communicate with any type of computerized device over any type of network and/or network addressable connection (e.g., using a web browser).

Figure 6:
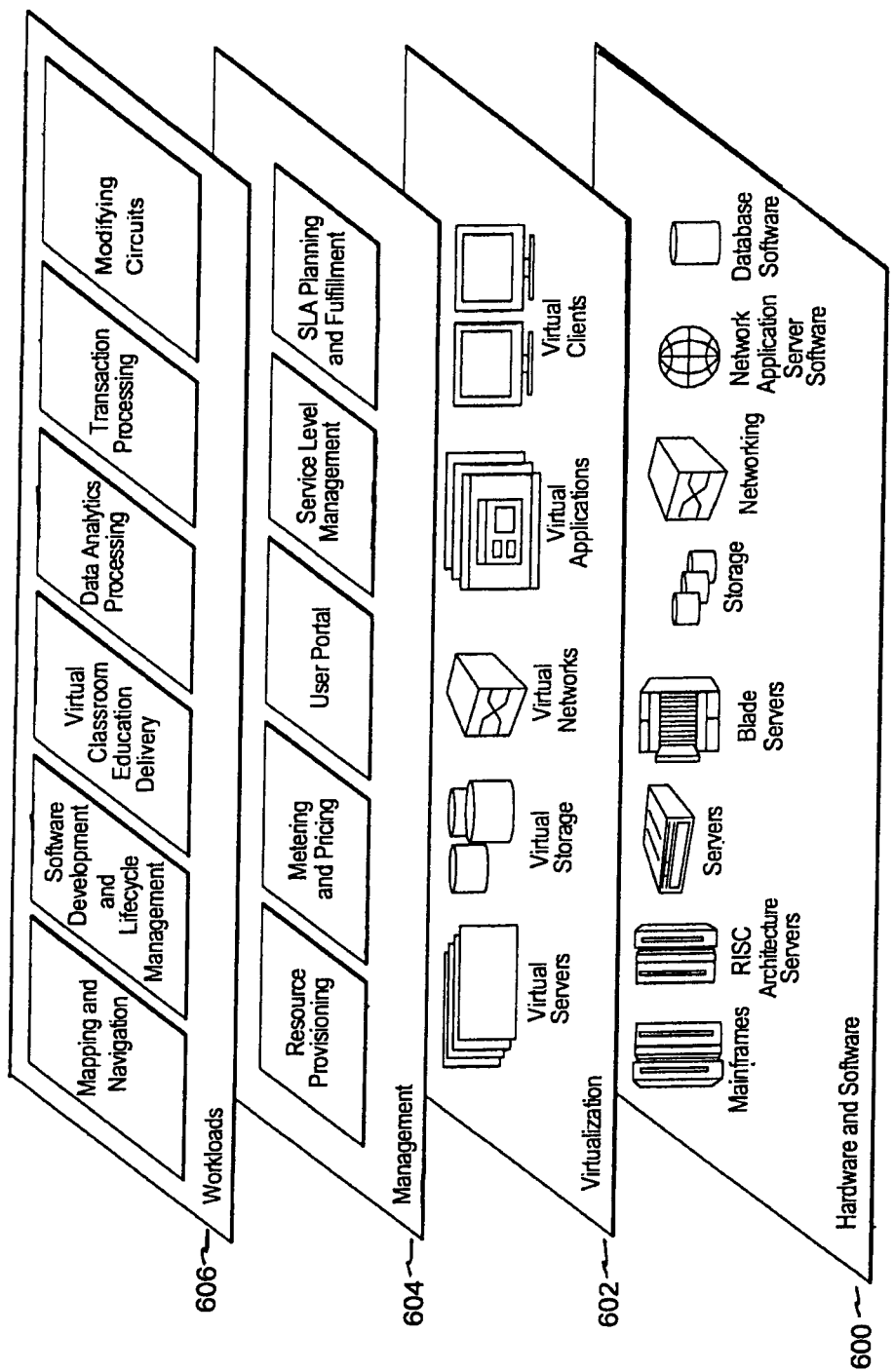
FIG. 6 depicts a set of functional abstraction layers provided by a cloud computing environment according to an embodiment described herein.

Referring now to FIG. 6, a set of functional abstraction layers provided by cloud computing environment 500 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 600 includes hardware and software components. Examples of hardware components include: mainframes; RISC (Reduced Instruction Set Computer) architecture based servers; servers; blade servers; storage devices; and networks and networking components. In some embodiments, software components include network application server software and database software.

Virtualization layer 602 provides an abstraction layer from which the following examples of virtual entities may be provided: virtual servers; virtual storage; virtual networks, including virtual private networks; virtual applications and operating systems; and virtual clients.

In one example, management layer 604 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 606 provides examples of functionality for which the cloud computing environment may be utilized. Examples of workloads and functions which may be provided from this layer include: mapping and navigation; software development and lifecycle management; virtual classroom education delivery; data analytics processing; transaction processing; and modifying a circuit to prevent redundant switching of a latch.

One or more aspects of the present invention are inextricably tied to computer technology and facilitate processing within a computer, improving performance thereof.

As described herein, according to an embodiment, a system for manufacturing circuits may include a processor to detect an unobservable cycle for at least one latch in a circuit design, wherein the unobservable cycle indicates the at least one latch is not observable to downstream logic in the circuit design. The system may also generate a coverage event to identify the unobservable cycle for the at least one latch and track the coverage event to detect a state associated with the unobservable cycle and a state change cycle, wherein the state change cycle is determined based on a simulation technique, and wherein the state change cycle comprises a cycle in which the at least one latch changes values from a previous state. In addition, the system may determine a redundant switching of the at least one latch based on the state associated with the unobservable cycle and the sate change cycle. Furthermore, the system may manufacture a circuit based on the circuit design, wherein the circuit design is modified to prevent the redundant switching of the at least one latch based in part on the unobservable cycle.

According to another embodiment, a method for manufacturing circuits may include detecting an unobservable cycle for at least one latch in a circuit design, wherein the unobservable cycle indicates the at least one latch is not observable to downstream logic in the circuit design. Additionally, the method may include generating a coverage event to identify the unobservable cycle for the at least one latch and tracking the coverage event to detect a state associated with the unobservable cycle and a state change cycle, wherein the state change cycle is determined based on a simulation technique, and wherein the state change cycle comprises a cycle in which the at least one latch changes values from a previous state. In addition, the method may include determining a redundant switching of the at least one latch based on the state associated with the unobservable cycle and the state change cycle. In addition, the method may include manufacturing a circuit based on the circuit design, wherein the circuit design is modified to prevent the redundant switching of the at least one latch based in part on the unobservable cycle.

According to another embodiment, a computer program product for manufacturing circuits may include a computer readable storage medium having program instructions embodied therewith, wherein the computer readable storage medium is not transitory signal per se. The program instructions can be executable by a processor to cause the processor to detect an unobservable cycle for at least one latch in a circuit design, wherein the unobservable cycle indicates the at least one latch is not observable to downstream logic in the circuit design. The program instructions can also be executable by a processor to cause the processor to generate a coverage event to identify the unobservable cycle for the at least one latch and track the coverage event to detect a state associated with the unobservable cycle and state change cycle, wherein the state change cycle is determined based on a simulation technique, and wherein the state change cycle comprises a cycle in which the at least one latch changes values from a previous state. In addition, the program instructions can also be executable by a processor to cause the processor to determine a redundant switching of the at least one latch based on the state associated with the unobservable cycle and the state change cycle and manufacture a circuit based on the circuit design, wherein the circuit design is modified to prevent the redundant switching of the at least one latch based in part on the unobservable cycle.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system to facilitate manufacturing of circuits comprising:
at least one processor to perform a method, the method comprising:
detecting an unobservable cycle for at least one latch in a circuit design, wherein the unobservable cycle indicates that the at least one latch is not observable to downstream logic in the circuit design;
generating a coverage event to identify the unobservable cycle for the at least one latch;
tracking the coverage event to detect a state associated with the unobservable cycle and a state change cycle, wherein the state change cycle is determined based on a simulation technique, and wherein the state change cycle comprises a cycle in which the at least one latch changes a value from a previous state;
determining a redundant switching of the at least one latch based on the state associated with the unobservable cycle and the state change cycle; and
initiating manufacturing of a circuit based on the circuit design, wherein the circuit design is modified to prevent the redundant switching of the at least one latch based in part on the unobservable cycle.

2. The system of claim 1, wherein the method further comprises generating an auxiliary latch associated with the at least one latch, wherein the auxiliary latch stores a previous value of the at least one latch.

3. The system of claim 1, wherein the unobservable cycle is based on a set of fanout points associated with the at least one latch.

4. The system of claim 1, wherein the detecting comprises detecting the unobservable cycle based on a set of sequential signals from interconnected computation logic.

5. The system of claim 1, wherein the coverage event comprises a plurality of signals to be monitored.

6. The system of claim 1, wherein the at least one latch is coupled to a multiplexer that receives a first signal from an array or a second signal from computation logic.

7. The system of claim 6, wherein the circuit design that is modified comprises logic to prevent power to the multiplexer in a condition in which the second signal is unobservable.

8. The system of claim 1, wherein the detecting further comprises detecting the unobservable cycle for the at least one latch in the circuit design via a formal verification technique.

9. The system of claim 1, wherein the generating further comprises generating the coverage event to identify the unobservable cycle for the at least one latch based on a formal verification technique.

10. A computer-implemented method to facilitate manufacturing of circuits comprising:
detecting an unobservable cycle for at least one latch in a circuit design, wherein the unobservable cycle indicates that the at least one latch is not observable to downstream logic in the circuit design;
generating a coverage event to identify the unobservable cycle for the at least one latch;
tracking the coverage event to detect a state associated with the unobservable cycle and a state change cycle, wherein the state change cycle is determined based on a simulation technique, and wherein the state change cycle comprises a cycle in which the at least one latch changes values from a previous state;
determining a redundant switching of the at least one latch based on the state associated with the unobservable cycle and the state change cycle; and
initiating manufacturing of a circuit based on the circuit design, wherein the circuit design is modified to prevent the redundant switching of the at least one latch based in part on the unobservable cycle, and wherein the detecting, generating, tracking, determining and initiating are performed using at least one processor.

11. The computer-implemented method of claim 10, further comprising generating an auxiliary latch associated with the at least one latch, wherein the auxiliary latch stores a previous value of the at least one latch.

12. The computer-implemented method of claim 10, wherein the unobservable cycle is based on a set of fanout points associated with the at least one latch.

13. The computer-implemented method of claim 10, wherein the detecting comprises detecting the unobservable cycle based on a set of sequential signals from interconnected computation logic.

14. The computer-implemented method of claim 10, wherein the coverage event comprises a plurality of signals to be monitored.

15. The computer-implemented method of claim 10, wherein the at least one latch is coupled to a multiplexer that receives a first signal from an array or a second signal from computation logic.

16. The computer-implemented method of claim 15, wherein the circuit design that is modified comprises logic to prevent power to the multiplexer in a condition in which the second signal is unobservable.

17. A computer program product for use in manufacturing circuits, the computer program product comprising:
a computer readable storage medium readable by a processing circuit and storing instructions for performing a method comprising:
detecting an unobservable cycle for at least one latch in a circuit design, wherein the unobservable cycle indicates that the at least one latch is not observable to downstream logic in the circuit design;
generating a coverage event to identify the unobservable cycle for the at least one latch;
tracking the coverage event to detect a state associated with the unobservable cycle and a state change cycle, wherein the state change cycle is determined based on a simulation technique, and wherein the state change cycle comprises a cycle in which the at least one latch changes values from a previous state;
determining a redundant switching of the at least one latch based on the state associated with the unobservable cycle and the state change cycle; and
initiating manufacturing of a circuit based on the circuit design, wherein the circuit design is modified to prevent the redundant switching of the at least one latch based in part on the unobservable cycle.

18. The computer program product of claim 17, wherein the method further comprises generating an auxiliary latch associated with the at least one latch, wherein the auxiliary latch stores a previous value of the at least one latch.

19. The computer program product of claim 17, wherein the unobservable cycle is based on a set of fanout points associated with the at least one latch.

20. The computer program product of claim 17, wherein the detecting comprises detecting the unobservable cycle based on a set of sequential signals from interconnected computation logic.

\* \* \* \* \*